United States Patent [19]
Baker et al.

[11] Patent Number: 5,620,945
[45] Date of Patent: Apr. 15, 1997

[54] PROCESS FOR FORMING A SUPERCONDUCTIVE FIBERFORM CERAMIC COMPOSITE

[75] Inventors: Anna L. Baker, Seattle; Michael Strasik, Renton, both of Wash.

[73] Assignee: The Boeing Company, Seattle, Wash.

[21] Appl. No.: 464,166

[22] Filed: Jun. 5, 1995

Related U.S. Application Data

[62] Division of Ser. No. 293,256, Aug. 19, 1994, which is a continuation of Ser. No. 833,862, Feb. 11, 1992, abandoned, which is a division of Ser. No. 381,489, Jul. 18, 1989, abandoned, which is a continuation-in-part of Ser. No. 698,496, Feb. 5, 1985, Pat. No. 5,041,321, which is a continuation-in-part of Ser. No. 667,568, Nov. 2, 1984, abandoned.

[51] Int. Cl.$^6$ .......................... H01L 39/24; H01L 39/12; C23C 18/12; H01B 12/02
[52] U.S. Cl. .......................... 505/440; 505/785; 505/126; 505/778; 505/779; 505/780; 505/776; 505/704; 505/735; 428/902; 428/688; 442/415
[58] Field of Search .................................. 505/126, 778, 505/779, 780, 776, 785, 704, 735, 440; 252/500, 518; 501/95, 97, 133; 75/327, 229, 235; 419/23, 24; 428/224, 280, 288, 902, 688; 427/62

[56] References Cited

U.S. PATENT DOCUMENTS

| | | | |
|---|---|---|---|
| 1,477,686 | 12/1923 | Braender | 220/461 |
| 2,379,126 | 6/1945 | Welden | 220/563 |
| 2,840,259 | 6/1958 | Steidl | 220/563 |
| 2,927,711 | 3/1960 | Naggiar | 220/564 |
| 3,702,279 | 11/1972 | Ardary et al. | 161/170 |
| 4,624,271 | 2/1987 | Rice | 428/698 |
| 4,642,271 | 2/1987 | Rice | 428/698 |
| 4,769,346 | 9/1988 | Gadkaree | 501/9 |
| 4,784,686 | 11/1988 | Meek | 252/518 |
| 4,797,378 | 1/1989 | Sowman | 501/95 |
| 4,828,774 | 5/1989 | Andersson et al. | 264/60 |
| 4,849,276 | 7/1989 | Bendig et al. | 428/117 |
| 4,861,753 | 8/1989 | McCarron, III | 505/1 |
| 4,882,304 | 11/1989 | Novich | 501/32 |
| 4,981,840 | 1/1991 | Brown et al. | 505/1 |
| 4,999,336 | 3/1991 | Nadkarni et al. | 505/1 |
| 5,000,998 | 3/1991 | Bendig et al. | 428/117 |
| 5,009,822 | 4/1991 | Sacks et al. | 264/23 |
| 5,021,369 | 6/1991 | Ackerman et al. | 501/95 |
| 5,041,321 | 8/1991 | Bendig | 428/102 |
| 5,075,282 | 12/1991 | Kolnuma et al. | 505/1 |
| 5,091,221 | 2/1992 | Chu et al. | 427/282 |
| 5,108,981 | 4/1992 | Safari et al. | 505/704 X |
| 5,112,802 | 5/1992 | Takano et al. | 505/1 |
| 5,182,255 | 1/1993 | Budd | 505/126 X |
| 5,198,282 | 3/1993 | Baker et al. | 428/114 |
| 5,202,306 | 4/1993 | Goretta et al. | 505/1 |
| 5,407,618 | 4/1995 | Stephenson | 501/12 X |
| 5,441,682 | 8/1995 | Baker et al. | 264/86 X |
| 5,534,468 | 7/1996 | Stephenson | 252/521 X |
| 5,549,850 | 8/1996 | Garrigus | 252/518 |

FOREIGN PATENT DOCUMENTS

| | | |
|---|---|---|
| 0296380 | 6/1987 | European Pat. Off. . |
| 248432 | 12/1987 | European Pat. Off. . |
| 0296380 | 12/1988 | European Pat. Off. . |
| 296380 | 12/1988 | European Pat. Off. . |
| 1242406 | 3/1988 | Japan . |
| 63-257131 | 10/1988 | Japan . |
| 63-248022 | 10/1988 | Japan . |
| WO90/04856 | 5/1990 | WIPO . |
| 9004856 | 5/1990 | WIPO . |

OTHER PUBLICATIONS

Chan et al., "Superconducting Pastes & Paints" in H. Kwok et al. (ed.), Superconductivity and its Applications, Elsevier, Apr. 18–20, 1988, pp. 208–213.
Surface Tension Confines Cryogenic Liquid, NASA Tech Briefs, Apr. 1989, p. 88.
Capillary–Pumped Heat–Transfer Loop, NASA Tech Briefs, Apr. 1989.
Expansion Valve With Temperature–Sensitive Flow Regulation, NASA Tech Briefs, Apr. 1989.
Ceramic Wick for Capillary–Pumped Heat Pipe, NASA Tech Briefs, Nov. 1989, p. 52.
Two–Pipe Heat Transfer Loop, NASA Tech Briefs, Sep. 1989, p. 94.
NASA Tech Brief (Apr. 1989) p. 88 "Surface Tension Confines Cryogenic Liquid," Goddard Space Flight Center.
NASA Tech Brief (Nov. 1989) p. 52 "Ceramic Wick for Capillary–Pum Heat Pipe", Goddard Space Flight Center.
NASA Tech Brief (Sep. 1989) p. 84 "Capillary–Pumped Heat–Transfer Loop," Marshall Space Flight Center.
NASA Tech Brief (Sep. 1989). p. 94, "Two–Pipe Heat–Transfer Loop," NASA Jet Propulsion Laboratory.
Japanese Journal of Applied Physics vol. 26, No. 4, Apr. 1987, pp. L399–L401, "Preparation of $(1a_{1-x}Sr_x)_2$ $CUO_{4-8}$ Superconductive Films by Screen Printing Method", Koinuma, et al.
Am. Ceramic Soc. Bulletin, vol. 67, No. 4, 1988, pp. 73–762 "Dissolution of $YB_{a2}Cu_3O_{(7-x)}$ in Various Solvents" Trolier, et al.
Ostertag, Ceramic Powder Science II, A. vol. 1., Nov. pp. 501–510, American Ceramic Society.
Japanese Journal of Applied Physics, vol. 26, No. 5, May 1987, pp. L761–762, "High $T_c$ Superconductivity in Screen Printed Yb – Ba – Cu –O Films," Koinumg, et al.
Chan et al., "Superconducting pastes and paints", *Superconductivity and Its Applications. Proceedings of the Second Annual Conference on Superconductivity and Applications*, held Apr. 18–20, 1988, Buffalo, New York, USA, Elsevier, 1988, pp. 208–213.

(List continued on next page.)

*Primary Examiner*—Douglas J. McGinty
*Attorney, Agent, or Firm*—John C. Hammar

[57] ABSTRACT

Processes are provided for forming a superconductive composite, comprising a superconductive metal oxide and a ceramic. The composite may be formed in any desired shape. Liquid nitrogen can be held around the superconductor longer and delivered in a more controlled fashion and the composite has improved resistance to shatter and thermal shock. The ceramic also provides protection from atmospheric deterioration of the superconductive oxide.

18 Claims, 1 Drawing Sheet

OTHER PUBLICATIONS

Mukherjee "Sol–Gel Process in Glass Science , , , " Journ. of. Non–Crystalline Solids, 42, 1980 pp. 477–488 No Month Available.

Johnson, Jr. et al "Fabrication of Ceramic Articles from High $T_c$. . . " Extended Abstracts–High To Supercond. 1987 Spring Meeting of Met. Res. Soc. Apr. 1987.

Nies et al. "Glass–Bonded Composites Containing Superconducting $YB_{a2}C_{m3}O_{9-x1.1}$" Mat. Res. Bull. vol. 23, pp. 623–630 1988.

Qni et al "Some properties of bulk Y–Ba–Cu–O compounds containing $SiO_2$." J. Appli Phys. vol. 64, No. 4, 15 Aug. 1988 pp. 2235–2237 No Month Available.

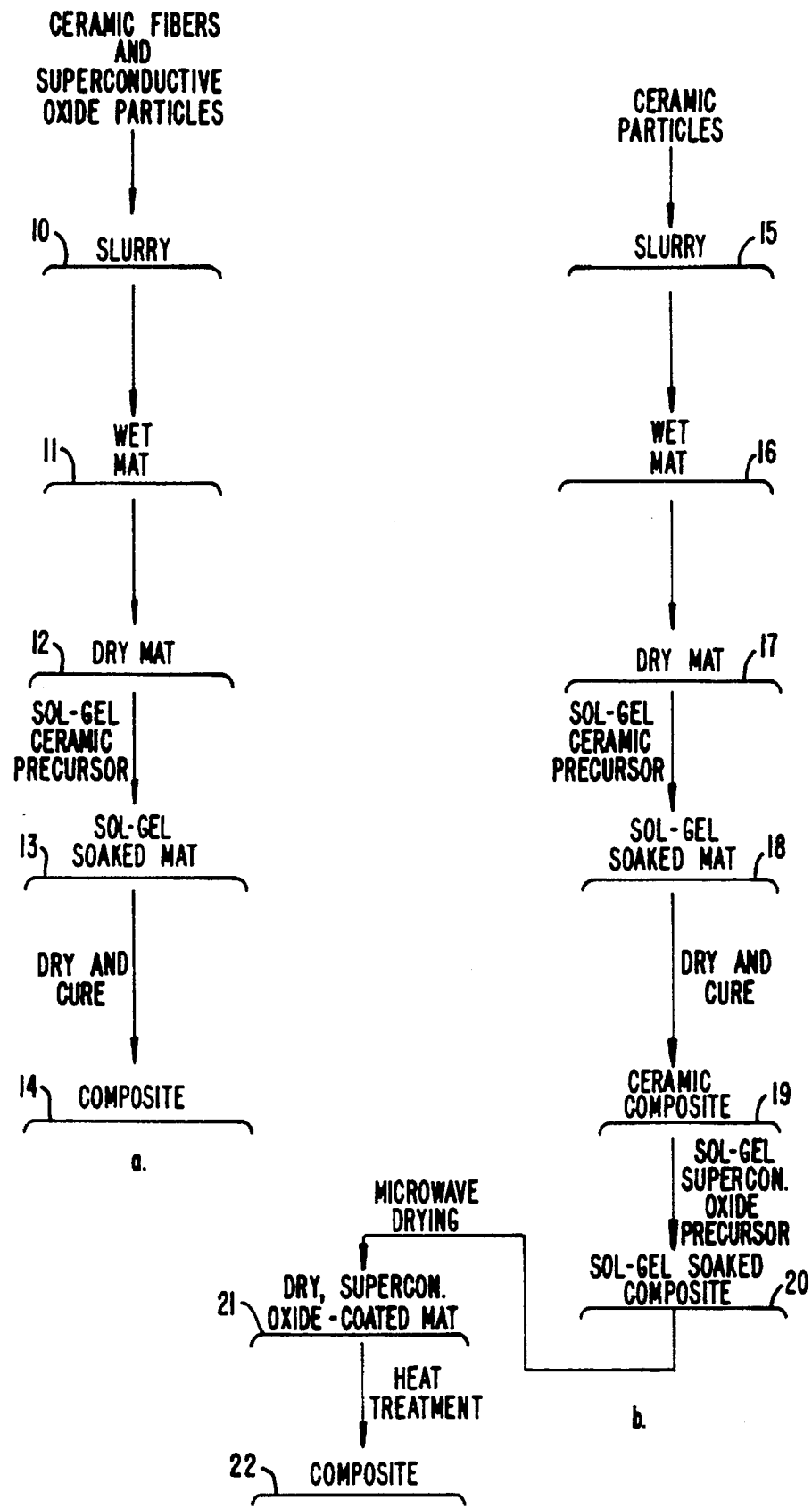
FIGURE

PROCESS FOR FORMING A SUPERCONDUCTIVE FIBERFORM CERAMIC COMPOSITE

This application is a division of U.S. Ser. No. 08/293,256, filed Aug. 19, 1994 and now allowed, which is a continuation of U.S. Ser. No. 07/833,862, filed Feb. 11, 1992 and now abandoned, which is a division of U.S. Ser. No. 07/381,489, filed Jul. 18, 1989 and now abandoned, which is a continuation-in-part of Ser. No. 06/698,496, filed Feb. 5, 1985 and now U.S. Pat. No. 5,041,321, which is a continuation-in-part of U.S. Ser. No. 06/667,568, filed Nov. 2, 1984 and now abandoned.

This application also is related to the subject matter of commonly-assigned U.S. Ser. No. 07/325,269, filed Mar. 17, 1989 and now pending, which is a continuation-in-part of U.S. Ser. No. 07/155,358, filed Feb. 12, 1988 and now abandoned; U.S. Ser. No. 06/875,807, filed Jun. 17, 1986 and now U.S. Pat. No. 4,849,276; U.S. Ser. No. 07/012,585, filed Jan. 9, 1987 and now pending; and U.S. Ser. No. 07/106,746, filed Oct. 8, 1987 and now U.S. Pat. No. 5,198,282.

This invention relates generally to a method for making superconductive fiberformed ceramic composites.

BACKGROUND OF THE INVENTION

Superconducting ceramic oxides are a recent technological breakthrough with promising applications in a wide range of areas. Superconductors are materials which transmit electricity without resistance loss and can sustain high magnetic fields when cooled below their superconducting transition temperature, $T_c$. The new class of superconducting ceramic oxides (sometimes also called superconducting mixed metal oxides or superconducting metal oxides) exhibit superconductivity above the temperature of liquid nitrogen, 77° K. (−321° F.), at ambient pressure, which signifies the ability to prepare and maintain superconductive materials now in virtually any laboratory. This is a tremendous advantage since the only presently commercially viable superconductor materials are those cooled with liquid helium, which is expensive and difficult to handle. However, even using the superconducting ceramic oxides, it is difficult to produce large, mechanically stable, complex shapes. The superconducting ceramic material is brittle, hard and difficult to handle without damaging the ceramic, and is particularly difficult to form into a wire or fiber which would be desirable for high current applications. For small scale applications (such as for microcomponents for electronic devices) low current carrying superconducting ceramic materials may be made in the form of single crystals. However, the technology for making large single crystals suitable for high current industrial uses is not yet practically available.

It is therefore an object of the present invention to provide a method of manufacturing superconductive fiberformed ceramic composites which exhibit superconductivity at liquid nitrogen temperatures, which do not require high temperature consolidation of the superconducting metal oxide powder, and which can be produced in large complex shapes at relatively low cost.

It is another object of the present invention to provide novel superconductive fiberformed ceramic composites which exhibit superconductivity at liquid nitrogen temperatures.

These and other objects of the present invention will be apparent from the following description of the preferred embodiments of the invention, the appended claims, and from the practice of the invention.

SUMMARY OF THE INVENTION

The present invention provides a process for forming a novel class of superconductive fiberformed ceramic composites. In general, the method of manufacture of such composites comprises forming a slurry in a liquid of superconductive metal oxide particles and ceramic fibers; dispersing the slurry over a form-defining porous surface and separating a substantial amount of the liquid from the slurry to thereby form a mat of particles and fibers; drying the mat; contacting the mat with a sol-gel ceramic precursor binder; and drying and curing the binder and mat to convert the precursor to a ceramic, thereby forming the composite. Other embodiments of the invention include, forming the slurry with ceramic fibers and forming a mat; drying the mat and contacting the mat with a sol-gel of a superconductive oxide precursor, drying the sol-gel and mat at a temperature and for a period of time to provide even, uniformly-coated fibers in the mat; then curing the mat and precursor to convert the precursor to the superconductive metal oxide. These coated fibers can then be separated and redispersed in the fiber-formed ceramic.

Another embodiment includes forming the slurry with ceramic fibers and forming the mat; drying the mat; contacting the mat with a sol-gel ceramic precursor binder; drying and curing the mat to convert the precursor to a ceramic; and finally contacting the ceramic composite thus formed with a superconductive oxide precursor which is cured and converted to the superconductive metal oxide.

The superconductive metal oxide particles utilized as starting materials may be powder, flakes or fibers, including super-conductive oxide-coated fibers where the coatings are prepared from sol-gel precursors on such ceramic fibers as zirconium oxide, alumina, Nextel 440, and the like.

BRIEF DESCRIPTION OF THE DRAWING

In the accompanying FIGURE, there are schematically shown two preferred embodiments of a process of manufacturing composites according to the present invention.

DESCRIPTION OF THE PREFERRED EMBODIMENTS

The present invention provides a method for producing composites comprising superconductive metal oxides and ceramics in a predetermined shape, such as tape, coated fibers, sheets, and the like. In the context of the description of the invention, the term "sol" will have its accepted technical meaning: a solution. The term "gel" will have its accepted technical meaning: a solution of a liquid that is polymerized into a solid by thermal or chemical means. As further used herein, the term "gel" will denote a heat-set or otherwise chemically-set gel which is ductile, flexible and handleable, but not fluid or viscous. This term will be used to distinguish from its non-heat-set or, non-chemically-set form which is still thick, viscous, pourable and castable, which will be referred to as a "sol-gel".

As used herein the term "ceramic" will have its normally accepted technical definition, and in addition, to distinguish it from the superconductive materials, the term "ceramic" herein will mean that it is non-superconducting. It is recognized that technically the superconductive mixed metal oxides are also ceramics, but to avoid confusion in the description of the invention, the superconductive materials will be referred to as superconductive mixed metal oxides or superconductive metal oxides. Furthermore, the adjectives "superconductive" and "superconducting" will both be utilized to describe the same material, with the former term describing the material when it is at a high temperature non-superconducting state, and the latter term used to refer to its low temperature superconducting state.

The sol-gel ceramic binders which are used herein and which can be cured to form a ceramic, are known in the art. For example, U.S. Pat. No. 3,640,093 discloses a method of preparing silicon oxides by forming a gel from hydrolyzed silicon alkoxide and metal salt. Thus the various sol-gel binders which can be cured to form ceramics include sol-gels used to form alumina, silica, mullite, zirconia, silicon nitride, or mixtures thereof.

The sol-gels of the superconductive metal oxide precursor utilized in the process according to the present invention are disclosed in commonly assigned copending U.S. patent application Ser. No. 07/325,269, filed Mar. 17, 1989, which is incorporated by reference herein in its entirety. These sol-gels can be cured by heat treatment to form superconductive mixed metal oxides having the formula $A_2GCu_3O_{7-x}$, wherein A is any group II metal, with barium and strontium being preferred; and G is any group III metal or lanthanide, with lanthanum and yttrium being the preferred group III metals and gadolinium and erbium being the preferred lanthanides. The integer x may vary from about 2 to about 3. while the exact empirical formulas of all mixed metal oxide superconductors are not known, another mixed metal oxide superconductor which may be made by the sol-gel method is represented by the formula $[Y_{1-x}Ba_x]_2CuO_{4-d}$, wherein d is 0 or any positive number less than 4 and x is 0 or any positive number less than 1.

The preferred embodiments of the invention will now be described in connection with the accompanying FIGURE. For convenience of description, the preferred embodiments will be described in connection with the preparation of three preferred types of composites, arbitrarily called Type A, Type B and Type C.

Type A

Referring to the figure, in the scheme marked (a), superconductive oxide particles, preferably as flakes or powder, will be slurried with ceramic fibers and a liquid. The preferred liquid is water, although other liquids may be utilized, particularly if miscible with water, as long as the liquid does not detrimentally interact or react with the oxide particles. The superconductive oxide flakes or powder may be provided by milling the superconductive oxide; spray-drying a sol-gel or liquid mix of superconductive oxide precursor, then curing to form the superconductive mixed metal oxide; or by freeze-drying a sol-gel or liquid mixed superconductive oxide precursor to form a lyophilized powder, and then curing the powder to form the superconductive metal oxide. Any other method for making powders or flakes of the mixed metal superconductive oxides may be utilized.

The superconductive oxide flakes or powders are then mixed with a liquid to form a slurry 10. The solids content of the slurry is not critical since the purpose of slurry is only to suspend the particles so that they may be uniformly distributed upon a form-defining surface. For convenience, however, a slurry comprising about 0.2 to 0.5 weight percent of the powders or flakes may be utilized. The size of the flakes or powder is also a matter of choice, depending upon the ultimate use of the composite. However, particle size in an average of 30 to 400 mesh will be conveniently useful.

After mixture of the slurry 10, it will be dispersed over a form-defining porous surface, which may be flat, irregular, or curved surface, including those with open interiors such as hollow cylinders or fustrums. Then, a substantial portion of the water will be removed from the slurry, thereby forming a soft mat consisting of the ceramic fibers and superconductive oxide powders or flakes. This may be done, for example, by utilizing a porous surface as the form-defining surface having pores of sufficient size to draw the liquid (water) therethrough, without passage of the fibers and oxide particles. Thus the slurry may be pulled by vacuum through the porous surface to form the mat of predetermined form.

There are other methods of removing the liquid from the slurry while forming the mat of the desired shape, such as spraying the slurry onto a porous surface, etc. The above method results in a wet mat 11 of the superconductive oxide particles and ceramic fibers.

The mat 11 is then heated to remove the liquid, which in the case of water, means it is preferably heated to a temperature of about 160° F. The duration of drying will, of course, depend on the size, shape and depth of the mat. This results in a dry mat 12.

Once the dry mat 12 has been obtained, a sol-gel ceramic precursor binder is contacted with the mat, soaking the fibers. Usually a light coating of the sol-gel binder is applied, with an air gelation used thereafter to stabilize the mat (by converting the sol-gel to a true gel) and then the temperature is raised to the appropriate temperature to cure the gel to form a ceramic. Usually such curing temperatures are in the range of about 500° to 700° F., preferably at about 600° F.

Therefore the sol-gel-soaked mat 13 is cured to form the desired composite 14.

The distribution of the sol-gel over the mat may be accomplished by wicking, spraying, or vacuum-infiltrating.

Preferably, after contacting the mat with the sol-gel, the binder is converted to a rigid gel, usually by air-drying. After gelling the binder, the mat is cured, usually by heating to about 200° F. for about four hours, then by slowly increasing the temperature to about 600° F. over a five hour period, and finally by rapidly reducing the temperature (quenching). After this initial stabilization step, additional steps of sol-gel saturation, ammonia gas gellation, and controlled cure cycle may also be performed to increase mechanical strength and density of the composite material. Preferably, two or three additional binder applications will be used. This forms a Type A composite which may be used, for example, for electromagnetic shielding of electronic equipment where weight-saving is a critical parameter.

The initial slurry 10 contains ceramic particles in addition to the superconductive oxide particles. These ceramic particles are preferably fibers. Preferably these ceramics will be fibers of silica, alumina, mullite, zirconia, aluminosilicate, silicon nitride or mixtures thereof which may be used at different concentrations, as desired.

The length and diameter of the ceramic particles, particularly as fibers, are conveniently about 1/16" to 4" while the diameter is conveniently in the range of between 1 and 3 microns. Preferred fibers are about 1/4" in length and about 1 micron in diameter. It will be realized that the only limitation to the ratio of ceramic particles to superconductive oxide particles is the concentration of the superconductive oxide particles will be sufficient for the composite to be superconductive, i.e., so that the density of the superconductive oxide particles is not so sparse as to allow the ceramic to insulate the particles from one another.

It will be realized, of course, that the scheme shown in the FIGURE (a) can be partially repeated by recontacting the composite (14) with the sol-gel ceramic precursor and drying the curing to increase the strength of the composite.

Type B

Referring to the figure under the scheme marked (b), a slurry 15 is first formed comprising ceramic fibers in a liquid, preferably water. The slurry 15 is dispersed over a form-defining surface and the water removed therefrom as described above to form a wet mat 16, which is subsequently dried to form a dry mat 17 of ceramic fibers. This dry mat 17 is processed as described in the Type A material through one or more sol-gel binder soak and cure cycles until the desired density ceramic composite 19 is accomplished. This ceramic composite 19 is then contacted with a sol-gel of a superconductive oxide precursor, such as that disclosed in the above-identified U.S. patent application Ser. No. 07/325,269. The sol-gel-soaked composite 20 is then dried, preferably by microwave radiation at a low power setting, typically less than about 10% of the full microwave power. This relatively low temperature drying process is important, since if rapid evaporation drying processes are used (such as drying under high vacuum or high heat) there may be uneven distribution of the deposited sol-gel, generally leaving thick crusts on the outer surfaces of the particles with very little deposited on the interior. After drying, the dry sol-gel-coated composite 21 is then cured under conditions sufficient to convert the sol-gel to the superconducting metal oxide and thereby forming the composite 22. Methods for curing a superconducting sol-gel precursor to form a superconducting oxide are disclosed, for example, in copending U.S. patent application Ser. No. 07/325,269. These Type B composites may be useful in device applications where continuous current-carrying capacity is needed, such as in transmission lines, sensors and detectors, magnetic storage systems, capacitors and the like.

The preferred sol-gel of the superconducting oxide precursor utilized in accordance with the present invention can be prepared as follows. A solution is first prepared containing soluble salts of the metals ultimately required in the mixed metal oxide superconductor. These salts are preferably soluble in water or in a water-miscible alcohol, such as methanol, ethanol, isopropanol, ethylene glycol and the like. The appropriate salts include those which provide, as a counterion to the metal ion, an ion which is removable by evaporative methods, or at least the hydrolysis product of which is removable by counterions such as the acetates and formates, as well as counterions which evolve as gases at an appropriate pH, such as the carbonates. To assist in solubilizing the metal salts, polyhydroxy compounds, such as, ethylene glycol, and organic acids, such as citric acid, malonic acid, acetic acid, and the like, may be added to form the metal salt solution. These polyhydroxy compounds and organic acids retain metal salts in solution, since some salts would precipitate under subsequent distillation conditions. Exemplary salts of those metals which comprise mixed metal oxide superconductors include, but are not limited to:

| | Soluble in |
|---|---|
| lanthanum carbonate | water (acid pH); EG/CA |
| barium acetate | water |
| yttrium acetate | water |
| erbium acetate | water |
| cupric carbonate | water |
| cupric hydroxide | water |
| cupric formate | water |
| lanthanum acetate | water |
| strontium formate | water |
| barium carbonate | EG/CA |
| gadolinium carbonate | EG/CA |
| | EG/CA = ethylene glycol and citric acid |

It is contemplated that in some instances an appropriate soluble salt of a desired metal may not be readily available. In such cases an available insoluble metal halide, such as the metal chloride, may be used to prepare a colloidal metal hydroxide which, in turn, may be later added to the peptized hydroxide sol containing the other metals required for the making of the mixed oxide superconductor. For example, a metal chloride may be reacted with water to form a colloidal metal hydroxide. The colloidal metal hydroxide may be separated from an ammonium chloride solution and then added to the sol containing the other hydroxides or oxides of the other metals. Exemplary halide salts which may be utilized in this manner include, but are not limited to:
barium chloride
barium fluoride
strontium fluoride
strontium iodide
strontium bromide
lanthanum chloride
gadolinium fluoride
erbium iodide
scandium iodide
dysprosium iodide
praseodymium chloride After preparation of the solution of soluble metal salts, if water is not already present in the solution, water is then added and the solution is subjected to hydrolyzing conditions whereby the counterions of the metal ions, or their hydrolysis products, are converted to moieties which are removable, by evaporative methods, such as by evolution of gas, or by evaporation of alcohols or organic acid. This may normally be done by distillation whereby the organic products are removed from the metals along with a substantial portion of the organic solvent and water. Subsequent to or simultaneous with distillation, the metals are converted by heating to oxides to form a mixed metal oxide precursor for the superconductor material.

The mixed metal oxide precursor, which is then typically a homogeneous semi-solid, is peptized to a sol, or fluid colloidal system, usually by addition of a strong mineral or organic acid, such as concentrated nitric acid, hydrochloric acid, lactic acid, and the like. This peptization step is usually conducted by heating at a temperature of less than about 100° C. At this time, metal colloidal gel, prepared by reacting metal halide and water, may be added to provide the metal or metals for which there were no available soluble salts. During this peptization process, the polymeric chains of the inorganic oxides are then formed.

Heating this sol produces a thick, viscous sol-gel which can then be contacted with the dry mat 12 or ceramic composite 19. After soaking into the mat, the sol-gel is heat or microwave-set to a gel.

As a final step, the mixed metal oxide coated composite in the desired hard-gelled shape, is fired at a temperature and for a period of time sufficient to oxidize and volatilize any remaining vapors and organic materials, thereby leaving an intact, dense, mixed metal oxide ceramic superconductor in its desired superconducting form. While this period of time will vary, usually one to six hours will suffice. Usually, the firing temperature will be in the range of about 900°–1100° C. The preferred firing temperatures are in the range of 900°–1000° C., most preferably at about 950° C. An annealing step at about 450° C. is also required. Those skilled in the art will know the precise heat treatment for each composition of superconductive oxide.

Although not required, in some instances it is desirable to provide a high-pressure (1 atm. or greater) oxygen heat treatment at a temperature of about 1000°–1100° C. to partially compensate the p-type semiconductor mixed metal oxide through a slight oxygen deficiency on the oxygen sublattice. Such a high-pressure oxygen firing would be desirable, for instance, to make sensitive components for solid state electronic devices.

The final mixed metal oxide superconductors include, but are not limited to, those having the formula $A_2GCu_3O_{7-x}$, wherein A is any Group II metal, with barium and strontium being preferred; and G is any Group III metal or lanthanide, with lanthanum and yttrium being the preferred Group III metals and gadolinium and erbium being the preferred lanthanides. In the aforementioned formula, x may vary from about 2 to 3. Another metal oxide superconductor, when yttrium is present is represented by the formula of $[Y_{1-x}Ba_x]_2CuO_{4-d}$, wherein d is zero or any positive value less than 4 and x is zero or any positive value less than 1. Particularly preferred mixed metal superconductors are those which are the mixed metal oxides or yttrium-barium-copper and gadolinium-barium-copper.

Type C

A Type C material is made as described above in connection with Type A materials except that the starting superconducting oxide particles are fibers rather than powders or flakes. These fibers can vary in length and diameter depending on the application and be either made of solid superconductive oxide or may be a hybrid superconductive oxide coating on a high-temperature ceramic fiber such as zirconium oxide, alumina, Nextel 440 and the like, all of which are known in the art. The volume loading of the superconductive oxide fibers or superconductive oxide coated ceramic fibers as compared to the ceramic fiber volume of the composite will depend upon the application of the composite and may be as high as 100%, i.e., the fibrous component of the composite would be all superconductive oxide fibers or superconductive oxide coated ceramic fibers, all bonded together with the sol-gel ceramic precursor binder as described in the Type A material. These Type C materials may be used for electromagnetic shielding of electronic equipment.

The composites made in accordance with the present invention have high surface area and provide a more stable cryogenic environment for exposure of the superconductive oxide elements to the liquid nitrogen environment under which they will be cooled. Moreover, the porous ceramic material provides a reservoir for delivery of liquid nitrogen to assist in the control of the superconductive effect while still resisting shattering from the thermal shock or embrittlement. Liquid nitrogen can then be held on the superconductor composite longer and delivered in a more controlled fashion such that the superconductive effect may be prolonged. Furthermore, the ceramic matrix around the superconducting oxide materials appears to provide protection from atmospheric deterioration.

Having described the preferred embodiments of the invention the following examples are provided by means of illustration and are not intended to limit the invention in any way.

EXAMPLE 1

A Type A composite material was made in the following way. Ten grams of HSA Fiberfrax aluminosilicate ceramic fiber and 5 grams of superconductive oxide powder were mixed in 2 gallons of water using an air powered stirrer for 3 minutes. The slurry was vacuum filtered onto a 3 inch diameter disk tool with a porous back plate recessed 1.5 inches from the surface. The resulting mat was dried at 160° F. for 8 hours. The dried mat was saturated with an alumina sol-gel ceramic precursor prepared after the method taught by Yoldas (as described in U.S. Ser. No. 667,658) and dried in an air circulating oven for 10 hours at 160° F. The temperature was raised to 600° F. over 3 hours and then held at 600° F. for 1 hour. The heat was turned off and the part cooled to ambient. The part was then resaturated with alumina sol-gel precursor and placed in a flowing ammonia gas atmosphere for 30 minutes. The part was then placed in the over for the same dry and cure cycle to 600° F. as described above. The part was removed and given another alumina sol-gel binder soak and cure cycle.

The finished part was soaked in liquid nitrogen and the whole disk, suspended by a fixed string, exhibited the Meisner effect in being deflected by a magnet held near the disk surface. Superconducting transition temperature ($T_c$) measurements showed the material to be superconductive.

EXAMPLE 2

A Type B material is made in the following way. An all-zirconium oxide ceramic fiber (without superconductive oxide fiber) composite material is made in the manner described in Example 1, except that the ceramic sol-gel precursor is one that forms zirconium oxide on curing. The superconductive oxide precursor is soaked into the ceramic fiber composite and fully saturates it. The saturated composite is then placed in a domestic microwave oven and dried for 30 minutes at 3% power. The dried composite is then heat treated to 920° C. at 1° per minute, held at 920° C. for 4 hours and then cooled at 1° per minute to 450° C. and held for 4 hours.

EXAMPLE 3

Superconductive oxide-coated ceramic fibers were made in the following way. A zirconium oxide ceramic fiber mat was vacuum filtered onto the same forming tool as in Example A. The mat was saturated with superconductive oxide sol-gel precursor and dried in a domestic microwave oven for 30 minutes at 3% power. The mat was then fired to 920° C. at 1° per minutes, held at 920° C. for 4 hours and then cooled at 1° per minute to 450° C. and held for 4 hours. The superconducting transition temperature ($T_c$) onset was observed at 93K.

EXAMPLE 4

A Type C material is made in the same fashion as Example 1 except that the superconductive oxide-coated zirconium oxide fibers made in Example 3 are separated into single fibers and dispersed in the initial slurry with HSA Fiberfrax aluminosilicate fibers and processing continues in the same way.

Having described the preferred embodiments of the invention, other modifications and alternative embodiments will be apparent, which will be within the spirit and scope of the present invention. The invention is not to be limited except in the scope of the following claims.

We claim:

1. A process for forming a superconductive composite, said composite comprising a superconductive metal oxide and a ceramic; comprising the steps of:
   (a) forming a slurry comprising superconductive metal oxide particles and ceramic fibers in a liquid;
   (b) dispersing said slurry over a form-defining surface and separating a substantial amount of said liquid from said slurry to thereby form a mat of said particles upon said form-defining surface;
   (c) drying said mat;
   (d) contacting said mat with a sol-gel ceramic precursor binder;
   (e) drying and curing said binder and mat at a sufficient temperature and for a period of time sufficient to convert said sol-gel precursor to said ceramic, to thereby form said composite.

2. A process according to claim 1 further comprising the repetition of steps (d) and (e) on said composite.

3. A process according to claim 1 wherein said superconductive metal oxide particles are in the form of a powder.

4. A process according to claim 1 wherein said superconductive metal oxide particles are in the form of flakes.

5. A process according to claim 1 wherein said superconductive metal oxide particles are in the form of fibers.

6. A process according to claim 1 wherein said ceramic and ceramic fibers are independently selected from the group consisting of silica, alumina, mullite, zirconia, aluminosilicate, silicon nitride or mixtures thereof.

7. A process according to claim 1 wherein said slurry comprises water.

8. A process for forming a superconductive composite, said composite comprising a superconductive metal oxide and a fibrous ceramic composite, comprising the steps of:
   (a) forming a slurry comprising ceramic fibers in a liquid;
   (b) dispersing said slurry over a form-defining surface separating a substantial amount of said liquid from said slurry to thereby form a mat of said fibers upon said form-defining surface;
   (c) drying said mat;
   (d) contacting said mat with a sol-gel ceramic precursor binder;
   (e) drying and curing said binder and mat at a sufficient temperature and for a period of time sufficient to convert said sol-gel precursor to said ceramic, to thereby form a first composite;
   (f) contacting said first composite with a sol-gel superconductive oxide precursor;
   (g) drying said sol-gel and first composite by microwave radiation;
   (h) curing said first composite and precursor at a sufficient temperature and for a period of time sufficient to convert said sol-gel precursor to said superconductive oxide, to thereby form said superconductive composite.

9. A process according to claim 8 further comprising repetition of steps (f), (g) and (h) on said superconductive composite.

10. A process according to claim 8 wherein said superconductive metal oxide is in the form of fibers.

11. A process according to claim 8 wherein said ceramic fibers are selected from the group consisting of silica, alumina, mullite, zirconia, aluminosilicate, silicon nitride or mixtures thereof.

12. A process according to claim 8 wherein said liquid comprises water.

13. A process according to claim 8 wherein said step (g) is conducted by low-power microwave radiation.

14. A process according to claim 1 wherein the form-defined surface is porous and the removal of liquid in step (b) from the slurry is performed by applying a vacuum on the opposite side of the form-defining surface to separate the liquid from the particles.

15. A process according to claim 8 wherein the form-defined surface is porous and the removal of liquid in step (b) from the slurry is performed by applying a vacuum on the opposite side of the form-defining surface to separate the liquid from the particles.

16. The process of claim 1 wherein the sol-gel ceramic precursor binder includes a compound selected from the group consisting of alumina, silica, mullite, zirconia, silicon nitride, and mixtures thereof.

17. The process of claim 1 wherein the superconductive metal oxide particles include yttrium, barium, copper, and oxygen.

18. The process of claim 1 wherein the ceramic fibers are selected from the group consisting of silica, alumina, mullite, zirconia, aluminosilicate, silicon nitride, and mixtures thereof.

* * * * *